(12) United States Patent
Kikitsu et al.

(10) Patent No.: US 12,484,205 B2
(45) Date of Patent: Nov. 25, 2025

(54) ELECTROMAGNETIC WAVE ATTENUATOR AND ELECTRONIC DEVICE

(71) Applicant: KABUSHIKI KAISHA TOSHIBA, Tokyo (JP)

(72) Inventors: Akira Kikitsu, Yokohama Kanagawa (JP); Yoshinari Kurosaki, Kawasaki Kanagawa (JP); Satoshi Shirotori, Yokohama Kanagawa (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 675 days.

(21) Appl. No.: 17/874,941

(22) Filed: Jul. 27, 2022

(65) Prior Publication Data

US 2023/0147383 A1 May 11, 2023

(30) Foreign Application Priority Data

Nov. 9, 2021 (JP) .................. 2021-182260

(51) Int. Cl.
*H05K 9/00* (2006.01)
*H01L 25/00* (2006.01)

(52) U.S. Cl.
CPC .......... *H05K 9/0088* (2013.01); *H01L 25/00* (2013.01)

(58) Field of Classification Search
CPC .. H05K 9/0088; H05K 9/0081; H05K 9/0083; H05K 9/009; H05K 9/0075
See application file for complete search history.

(56) References Cited

U.S. PATENT DOCUMENTS

| 2018/0077829 | A1* | 3/2018 | Yamamoto | B32B 15/08 |
| 2018/0337139 | A1 | 11/2018 | Kikitsu et al. | |
| 2019/0080978 | A1* | 3/2019 | Kumura | H01L 23/373 |
| 2019/0081007 | A1 | 3/2019 | Iwasaki et al. | |
| 2020/0066608 | A1 | 2/2020 | Kikitsu et al. | |
| 2020/0227358 | A1* | 7/2020 | Kikitsu | H01F 10/16 |
| 2020/0243457 | A1 | 7/2020 | Kikitsu et al. | |

FOREIGN PATENT DOCUMENTS

| JP | H10-289435 A | 10/1998 |
| JP | 2007-243122 A | 9/2007 |
| JP | 2012-33764 A | 2/2012 |
| JP | 2012-38807 A | 2/2012 |
| JP | 2018-41962 A | 3/2018 |
| JP | 2018-195660 A | 12/2018 |
| JP | 2019-54059 A | 4/2019 |
| JP | 2020-31188 A | 2/2020 |
| JP | 2020-113650 A | 7/2020 |
| JP | 2020-120066 A | 8/2020 |

OTHER PUBLICATIONS

Japan Patent Office, Office Action in JP App. No. 2021-182260, 2 pages, and machine translation, 4 pages (Sep. 30, 2024).

\* cited by examiner

*Primary Examiner* — Alicia J Weydemeyer
(74) *Attorney, Agent, or Firm* — Finnegan, Henderson, Farabow, Garrett & Dunner, LLP

(57) ABSTRACT

According to one embodiment, an electromagnetic wave attenuator includes a stacked member. The stacked member includes a base body including a first surface including unevenness, a first conductive member including Cu, and a first layer provided between the first surface and the first conductive member. The first layer includes Cr and Ti.

15 Claims, 9 Drawing Sheets

ELECTROMAGNETIC WAVE ATTENUATOR AND ELECTRONIC DEVICE

CROSS-REFERENCE TO RELATED APPLICATIONS

This application is based upon and claims the benefit of priority from Japanese Patent Application No. 2021-182260, filed on Nov. 9, 2021; the entire contents of which are incorporated herein by reference.

FIELD

Embodiments described herein relate generally to an electromagnetic wave attenuator and an electronic device.

BACKGROUND

For example, an electromagnetic wave attenuator such as an electromagnetic shield sheet or the like has been proposed. There is an electronic device that includes the electromagnetic wave attenuator and a semiconductor element. It is desirable that the electromagnetic wave attenuator stably attenuates the electromagnetic wave.

DETAILED DESCRIPTION

Figure 1A:
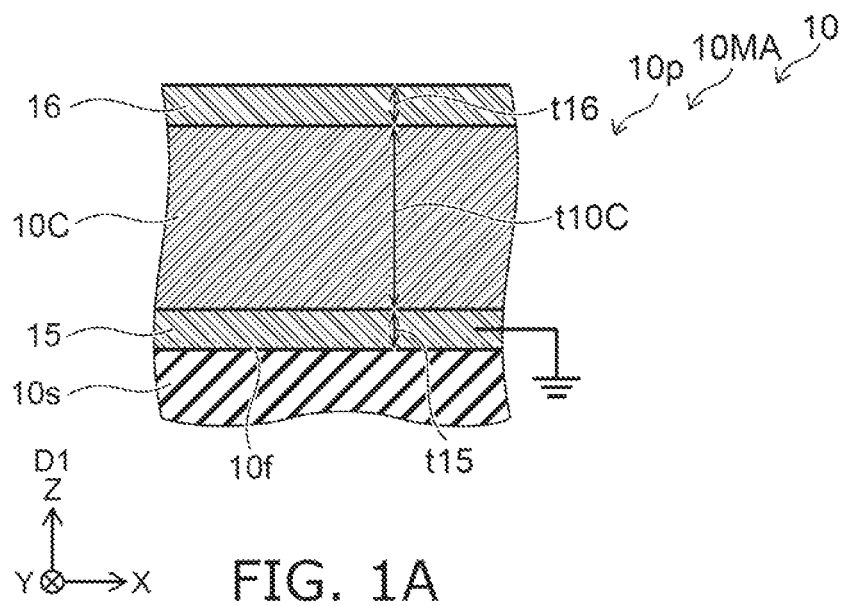
FIGS. 1A and 1B are schematic cross-sectional views illustrating an electromagnetic wave attenuator according to a first embodiment.

According to one embodiment, an electromagnetic wave attenuator includes a stacked member. The stacked member includes a base body including a first surface including unevenness, a first conductive member including Cu, and a first layer provided between the first surface and the first conductive member. The first layer includes Cr and Ti.

According to one embodiment, an electronic device includes the electromagnetic wave attenuator described above, and an electronic element.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

Figure 1B:
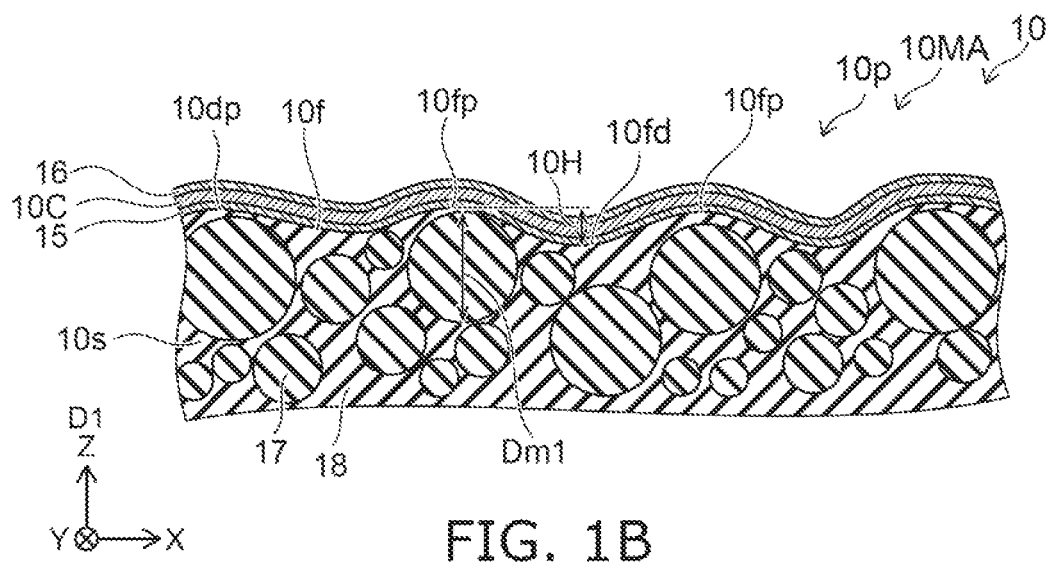

FIGS. 1A and 1B are schematic cross-sectional views illustrating an electromagnetic wave attenuator according to a first embodiment.

FIG. 1A is an enlarged view of a part of FIG. 1B. As shown in FIGS. 1A and 1B, the electromagnetic wave attenuator 10 according to the embodiment includes a stacked member 10MA. As will be described later, the stacked member 10MA may include a first planar portion 10p and a side surface portion. FIGS. 1A and 1B illustrate the first planar portion 10p.

The stacked member 10MA includes a base body 10s, a first conductive member 10C, and a first layer 15. The base body 10s includes a first surface 10f. The first surface 10f includes unevenness 10dp.

The first conductive member 10C includes Cu. The first layer 15 is provided between the base body 10s (first surface 10f) and the first conductive member 10C. The first layer 15 includes Cr and Ti. The first layer 15 includes, for example, an alloy including Cr and Ti.

As shown in FIG. 1, for example, the first conductive member 10C may be grounded. For example, an electromagnetic wave is incident on the first conductive member 10C. The electromagnetic wave incident on the first conductive member 10C is attenuated by the first conductive member 10C. The electromagnetic wave attenuator 10 can be used as, for example, a shield of an electromagnetic wave.

In the electromagnetic wave attenuator 10 according to the embodiment, it is possible to stably attenuate the electromagnetic wave.

For example, the first layer 15 is provided in contact with the first surface 10f including unevenness of 10dp. The first conductive member 10C is provided in contact with the first layer 15. The electromagnetic wave attenuator 10 (for example, the first conductive member 10C) functions as, for example, an electromagnetic shielding layer. The first conductive member 10C including Cu attenuates the incident electromagnetic wave.

In a reference example, the first conductive member 10C is provided in contact with the base body 10s. In the reference example, the first conductive member 10C is easily peeled off from the base body 10s. In the reference example, it may be difficult to stably keep a function of attenuating the electromagnetic wave.

In the embodiment, the unevenness 10dp is provided on the first surface 10f of the base body 10s. The first layer 15 is provided so as to be in contact with the unevenness of 10dp. The first conductive member 10C is provided so as to be in contact with the first layer 15. In FIG. 1A, the unevenness 10dp of the first surface 10f is omitted.

By providing the unevenness 10dp on the first surface 10f, the area in which the base body 10s and the first layer 15 are in contact with each other becomes larger than in the case where the unevenness is not provided. High adhesion can be easily obtained.

The first layer 15 includes Cr and Ti. The first layer 15 including Cr and Ti is provided between the base body 10s and the first conductive member 10C. The first layer 15 including Cr and Ti has high adhesion to the base body 10s. The first layer 15 including Cr and Ti has high adhesion to the first conductive member 10C. The first layer 15 functions as, for example, an under layer for improving adhesion.

In the embodiment, peeling-off of the first conductive member 10C from the base body 10s can be suppressed by providing the first layer 15 including Cr and Ti. According to the embodiment, it is possible to provide an electromagnetic wave attenuator capable of stably attenuating the electromagnetic wave.

As shown in FIGS. 1A and 1B, a first direction D1 from the base body 10s to the first conductive member 10C is defined as a Z-axis direction. One direction perpendicular to the Z-axis direction is defined as an X-axis direction. A direction perpendicular to the Z-axis direction and the X-axis direction is defined as a Y-axis direction.

As shown in FIG. 1B, the unevenness 10dp includes a recess 10fd and a protrusion 10fp. The height (or depth) of the unevenness of 10dp is defined as a height of 10H. The height 10H corresponds to a distance in the first direction D1 between the recess 10fd and the protrusion 10fp.

As shown in FIG. 1A, a thickness of the first layer 15 is defined as a thickness t15. The thickness t15 corresponds to a length of the first layer 15 along the first direction D1.

In the embodiment, the height 10H of the unevenness 10dp is larger than the thickness t15 of the first layer 15. The first layer 15 is stacked along the first surface 10f including the unevenness 10pd. High adhesion can be easily obtained due to the thin first layer 15 along the unevenness of 10dp.

In one example, the height 10H of the unevenness 10dp is not less than 1 μm and not more than 100 μm. In one example, the thickness t15 of the first layer 15 is not less than 1 nm and not more than 30 nm. Due to the unevenness 10dp and the first layer 15, high adhesion can be easily obtained.

As shown in FIG. 1B, the base body 10s includes, for example, multiple particles 17 and a resin 18. The resin 18 is provided around the multiple particles 17. The multiple particles 17 include, for example, a first element including at least one selected from the group consisting of silicon and aluminum, and oxygen. In one example, the multiple particles 17 include silicon oxide (e.g., $SiO_2$). The resin 18 may include, for example, at least one selected from the group consisting of epoxy and polyimide.

By providing the multiple particles 17, high mechanical stability can be obtained in the base body 10s. High insulation and high stability can be obtained.

When the base body 10s includes the multiple particles 17, by providing the first layer 15 (foundation layer) including Cr and Ti, particularly high adhesion can be easily obtained.

When the base body 10s includes the multiple particles 17, it is considered that the elements included in the first layer 15 are diffused into the base body 10s. For example, Cr included in the first layer 15 easily diffuses into the base body 10s. For example, Cr easily binds to multiple particles (for example, silicon oxide particles) included in the base body 10s. As a result, it is considered that high adhesion can be obtained.

For example, Cr included in the first layer 15 diffuses inside the multiple particles 17 and easily binds to the multiple particles 17. For example, Cr spreads from the first layer 15 to the multiple particles 17. As a result, high adhesion can be obtained. A concentration of Cr inside the multiple particles 17 may be higher than a concentration of Cr in the resin 18.

In the embodiment, a diameter Dm1 of at least one of the multiple particles 17 (see FIG. 1B) is, for example, not less than 1 nm and not more than 100 μm. The average diameter Dm1 of the multiple particles 17 is, for example, not less than 10 nm and not more than 100 μm.

As shown in FIGS. 1A and 1B, the stacked member 10MA may include a second layer 16. The second layer 16 includes Cr and Ti. The second layer 16 includes, for example, an alloy including Cr and Ti. A first conductive member 10C is provided between the first layer 15 and the second layer 16.

The second layer 16 functions as, for example, a protective layer. The second layer 16 has high adhesion to the first conductive member 10C. The second layer 16 suppresses deterioration of the first conductive member 10C. By providing the second layer 16, a stable first conductive member 10C can be obtained.

The second layer 16 has a thickness of t16 (see FIG. 1A). The thickness t16 may be, for example, not less than 1 nm and not more than 30 nm. The first conductive member 10C has a thickness of t10C (see FIG. 1A). The thickness t10C is, for example, not less than 0.5 μm and not more than 100 μm.

Figure 2:
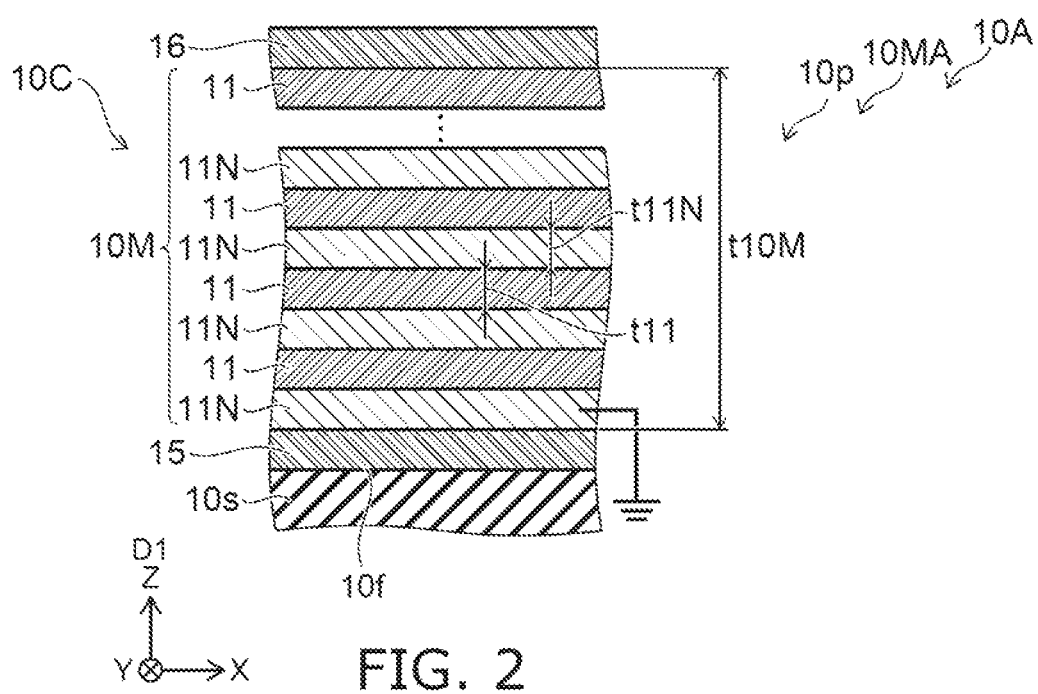
FIG. 2 is a schematic cross-sectional view illustrating an electromagnetic wave attenuator according to the first embodiment.

FIG. 2 is a schematic cross-sectional view illustrating an electromagnetic wave attenuator according to the first embodiment.

As shown in FIG. 2, in an electromagnetic wave attenuator 10A according to the embodiment, the first conductive member 10C includes the first stacked body 10M. Other configurations of the electromagnetic wave attenuator 10A may be the same as the configuration of the electromagnetic wave attenuator 10. In FIG. 2, the unevenness 10dp of the first surface 10f is omitted.

The first stacked body 10M includes multiple first magnetic layers 11 and multiple first non-magnetic layers 11N. The multiple first non-magnetic layers 11N includes Cu. One of the multiple first magnetic layers 11 is between one of the multiple first non-magnetic layers 11N and another one of the multiple first non-magnetic layers 11N. One of the multiple first non-magnetic layers 11N is between one of the multiple first magnetic layers 11 and another one of the multiple first magnetic layers 11. For example, the first magnetic layer 11 and the first non-magnetic layer 11N are alternately provided. A direction from one of the multiple first non-magnetic layers 11N to another of the multiple first non-magnetic layers 11N is along the first direction D1.

With such a first stacked body 10M, electromagnetic waves can be attenuated more effectively. In particular, it effectively attenuates electromagnetic waves in the frequency range of not more than 100 MHz.

One of the multiple first non-magnetic layers 11N is in contact with one of the multiple first magnetic layers 11 and another one of the multiple first magnetic layers 11.

The multiple first magnetic layers 11 include, for example, at least one selected from the group consisting of Fe, Ni and Co. The multiple first magnetic layers 11 may further include at least one selected from the group consisting of Cu, Mo and Cr. The multiple first magnetic layers 11 are, for example, soft magnetic layers. In one example, the multiple first magnetic layers 11 are, for example, NiFeCuMo layers. Good soft magnetic properties can be obtained.

In the first stacked body 10M, the number of the multiple first magnetic layers 11 may be the same as the number of the multiple first non-magnetic layers 11N, may be 1 larger than the number of the multiple first non-magnetic layers 11N, or may be 1 smaller than the number of the multiple first non-magnetic layers 11N. For example, the number of the multiple first magnetic layers 11 is, for example, not less than 2 and not more than 200. The number of the multiple first non-magnetic layers 11N is, for example, not less than 2 and not more than 200.

One thickness t11 of the multiple first magnetic layers 11 is, for example, not less than 20 nm and not more than 1000 nm. One thickness t11N of the multiple first non-magnetic layers 11N is, for example, not less than 20 nm and not more than 1000 nm. A thickness t10M of the first stacked body 10M is, for example, not less than 200 nm and not more than 100 μm.

Figure 3:
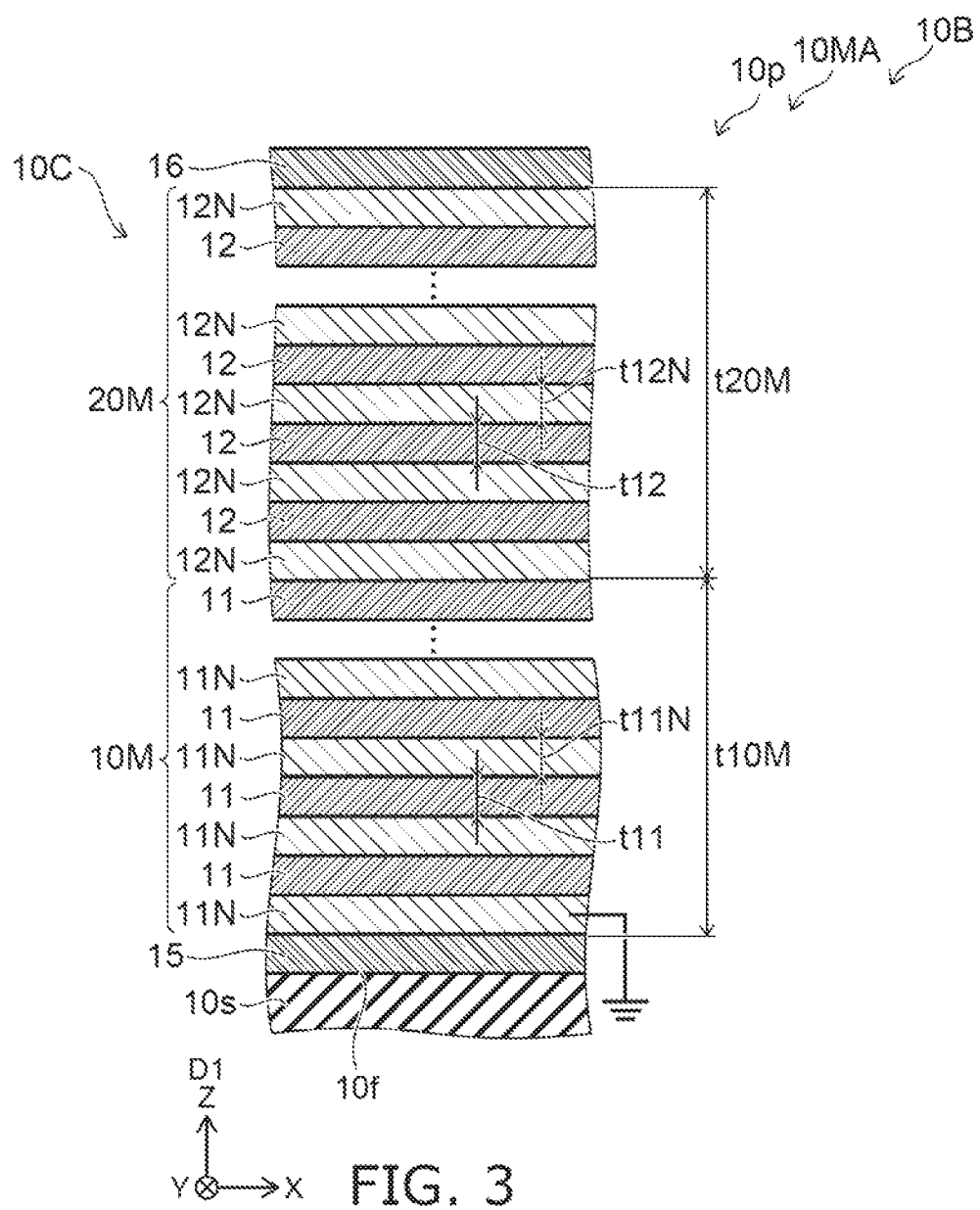
FIG. 3 is a schematic cross-sectional view illustrating an electromagnetic wave attenuator according to the first embodiment.

FIG. 3 is a schematic cross-sectional view illustrating an electromagnetic wave attenuator according to the first embodiment.

As shown in FIG. 3, in an electromagnetic wave attenuator 10B according to the embodiment, the first conductive member 10C includes a second stacked body 20M. Other configurations of the electromagnetic wave attenuator 10B may be the same as the configuration of the electromagnetic wave attenuator 10A. In FIG. 3, the unevenness 10dp of the first surface 10f is omitted.

The second stacked body 20M includes multiple second magnetic layers 12 and multiple second non-magnetic layers 12N. At least one of the multiple second non-magnetic layers 12N includes at least one selected from the group consisting of Ta, Ti, W, Mo, Nb and Hf. At least one of the multiple second non-magnetic layers 12N may further includes at least one selected from the group consisting of Cu, Al, Ni, Cr, Mn, Mo, Zr and Si. For example, at least one of the multiple second non-magnetic layers 12N includes Cr and Ti. For example, at least one of the multiple second non-magnetic layers 12N includes Ta.

One of the multiple second magnetic layers 12 is between one of the multiple second non-magnetic layers 12N and another one of the multiple second non-magnetic layers 12N. One of the multiple second non-magnetic layers 12N is between one of the multiple second magnetic layers 12 and another one of the multiple second magnetic layers 12. For example, the second magnetic layer 12 and the second non-magnetic layer 12N are alternately provided. A direction from one of the multiple second non-magnetic layers 12N to another one of the multiple second non-magnetic layers 12N is along the first direction D1.

With such a second stacked body 20M, electromagnetic waves can be attenuated more effectively. For example, it effectively attenuates electromagnetic waves in the frequency domain of not more than 60 MHz.

One of the multiple second non-magnetic layers 12N is in contact with one of the multiple second magnetic layers 12 and another one of the multiple second magnetic layers 12.

The multiple second magnetic layers 12 include, for example, at least one selected from the group consisting of Fe, Ni and Co. The multiple second magnetic layers 12 may further include at least one selected from the group consisting of Cu, Mo and Cr. The multiple second magnetic layers 12 are, for example, soft magnetic layers. In one example, the multiple second magnetic layers 12 are, for example, NiFeCuMo layers. Good soft magnetic properties can be obtained.

In the second stacked body 20M, the number of the multiple second magnetic layers 12 may be the same as the number of the multiple second non-magnetic layers 12N, may be 1 larger than the number of the multiple second non-magnetic layers 12N, or may be 1 smaller than the number of the multiple second non-magnetic layers 12N. For example, the number of the multiple second magnetic layers 12 is, for example, not less than 2 and not more than 200. The number of the multiple second non-magnetic layers 12N is, for example, not less than 2 and not more than 200.

One thickness t12 of the multiple second magnetic layers 12 is, for example, not less than 10 nm and not more than 500 nm. One thickness t12N of the multiple second non-magnetic layers 12N is, for example, not less than 1 nm and not more than 100 nm. A thickness t20M of the second stacked body 20M is, for example, not less than 200 nm and not more than 100 μm.

In the example of FIG. 3, the first stacked body 10M is provided between the first layer 15 and the second stacked body 20M. In the embodiment, the second stacked body 20M may be provided between the first layer 15 and the first stacked body 10M.

In the embodiment, as described below, each of the multiple magnetic layers may have an uneven shape.

Hereinafter, a case where each of the multiple first magnetic layers 11 has an uneven shape will be described. The following description may be applied to the multiple second magnetic layers 12. Each of the multiple second magnetic layers 12 may have an uneven shape.

Figure 4:
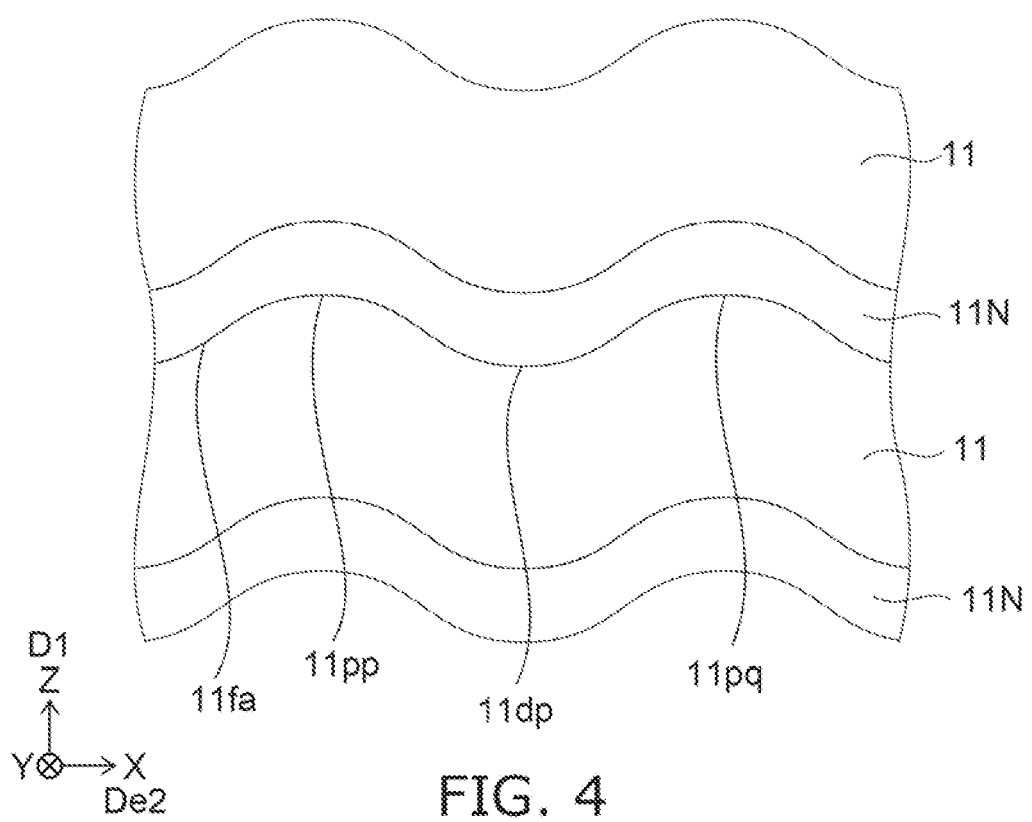
FIG. 4 is a schematic cross-sectional view illustrating the electromagnetic wave attenuator according to the embodiment.

FIG. 4 is a schematic cross-sectional view illustrating the electromagnetic wave attenuator according to the embodiment.

As shown in FIG. 4, each of the multiple first magnetic layers 11 has an uneven shape. The multiple first non-magnetic layers 11N follow the uneven shape of the multiple first magnetic layers 11.

One of the multiple first magnetic layers 11 includes a first magnetic layer surface 11fa. The first magnetic layer surface 11fa faces one of the multiple first non-magnetic layers 11N. The first magnetic layer surface 11fa includes a first top portion 11pp, a second top portion 11pq, and a first bottom portion 11dp. One direction that crosses the first direction D1 is defined as a crossing direction De2. The crossing direction De2 is, for example, the X-axis direction.

A position of the first bottom portion 11dp in the crossing direction De2 is between a position of the first top portion 11pp in the crossing direction De2 and a position of the second top portion 11pq in the crossing direction De2. At least a part of the multiple first non-magnetic layers 11N is between the first top portion 11pp and the second top portion 11pq in the crossing direction De2. A distance along the first direction D1 between the first top portion 11pp and the first bottom portion 11dp is, for example, not less than 10 nm. The distance corresponds to the height (depth) of the unevenness.

It is considered that magnetostatic interaction of magnetization between one of the multiple first magnetic layers 11 and another one of the multiple first magnetic layers 11 becomes larger by providing such an uneven shape, for example.

Second Embodiment

The second embodiment relates to an electronic device. The electronic device according to the embodiment includes the electromagnetic wave attenuator according to the first embodiment and an arbitrary electronic element. The electromagnetic wave attenuator according to the first embodiment is, for example, the electromagnetic wave attenuator 10, the electromagnetic wave attenuator 10A, the electromagnetic wave attenuator 10B, or the like.

FIGS. 5A to 5D are schematic views illustrating an electronic device according to a second embodiment.

Figure 5A:
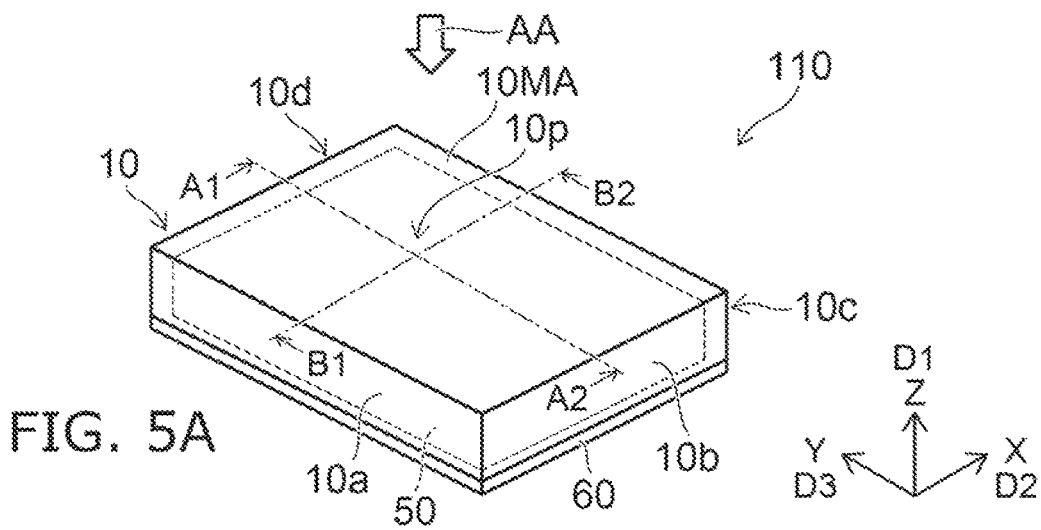
FIGS. 5A to 5D are schematic views illustrating an electronic device according to a second embodiment.
Figure 5B:
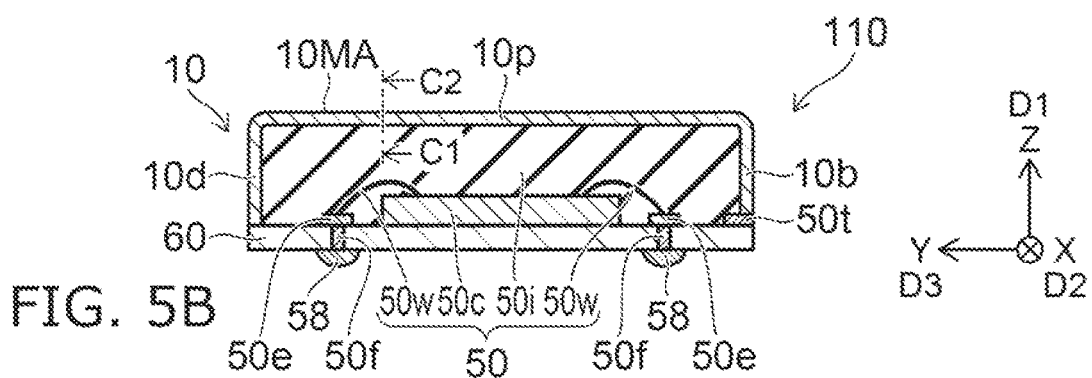
Figure 5C:
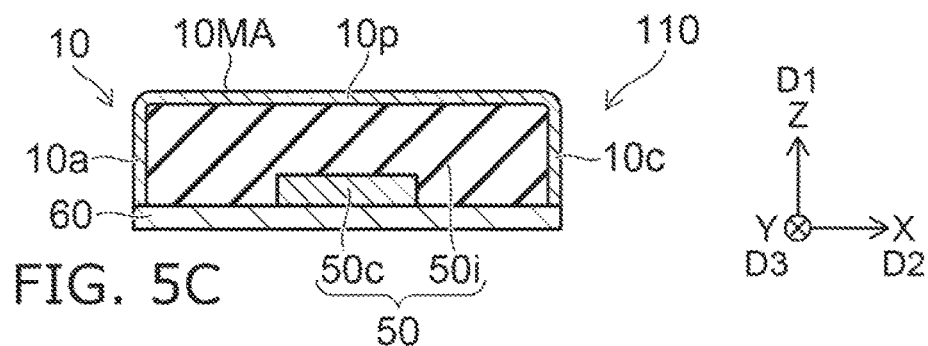
Figure 5D:
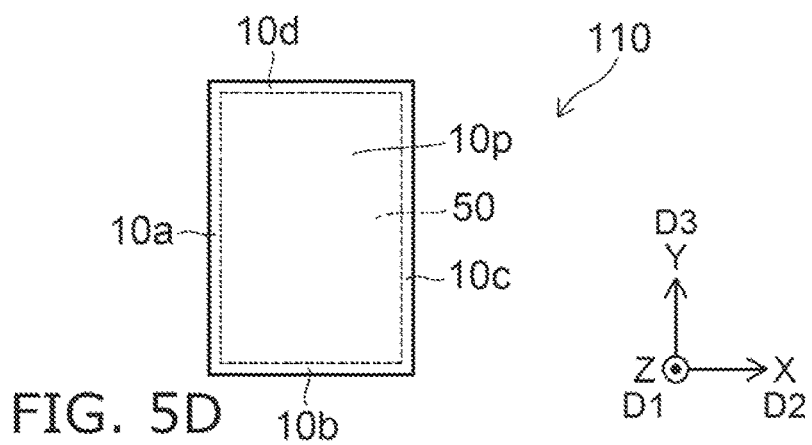

FIG. 5A is a perspective view. FIG. 5B is a line A1-A2 cross-sectional view of FIG. 5A. FIG. 5C is a line B1-B2 cross-sectional view of FIG. 5A. FIG. 5D is a plan view as viewed along arrow AA of FIG. 5A. FIGS. 1 to 3 correspond to a line C1-C2 cross section of FIG. 5B.

As shown in FIG. 5A, the electronic device 110 according to the embodiment includes an electronic element 50 and the electromagnetic wave attenuator (in the example, electromagnetic wave attenuator 10). A substrate 60 is further provided in the example. The electromagnetic wave attenuator 10 covers at least a part of the electronic element 50. The electronic element 50 is, for example, a semiconductor element.

In the example as shown in FIG. 5B, the electronic element 50 includes a semiconductor chip 50c, an insulating portion 50i, and a wire 50w. In the example, an electrode 50e, a substrate connector 50f, and a connector 58 are provided at the substrate 60. The wire 50w electrically connects the electrode 50e and a part of the semiconductor chip 50c. The electrode 50e and the connector 58 are electrically connected by the substrate connector 50f. The substrate connector 50f pierces the substrate 60. The connector 58 functions as an input/output portion of the semiconductor chip 50c. The connector 58 may be, for example, a terminal. The insulating portion 50i is provided around the semiconductor chip 50c. The insulating portion 50i includes, for example, at least one of a resin or a ceramic, etc. The semiconductor chip 50c is protected by the insulating portion 50i.

The electronic element 50 includes, for example, at least one of an arithmetic circuit, a control circuit, a memory circuit, a switching circuit, a signal processing circuit, or a high frequency circuit.

The base body 10s of the electromagnetic wave attenuator 10 (referring to FIG. 1) may be, for example, at least a part of the electronic element 50. The base body 10s of the electromagnetic wave attenuator 10 may be, for example, at least a part of the insulating portion 50i.

In the example as illustrated in FIG. 5B, the electromagnetic wave attenuator 10 is electrically connected to a terminal 50t provided at the substrate 60. The electromagnetic wave attenuator 10 is set to one potential (e.g., the ground potential) via the terminal 50t. For example, the electromagnetic wave attenuator 10 attenuates the electromagnetic waves radiated from the electronic element 50. For example, the electromagnetic wave attenuator 10 functions as a shield.

As shown in FIGS. 5A to 5C, the stacked member 10MA of the electromagnetic wave attenuator 10 includes a first planar portion 10p and a first side surface portion 10a. In the example, the stacked member 10MA includes first to fourth side surface portions 10a to 10d. A direction from the electronic element 50 to the first planar portion 10p is aligned with the first direction D1 (e.g., the Z-axis direction).

As shown in FIGS. 5B and 5C, the electronic element 50 is positioned between the first planar portion 10p and the substrate 60 in the first direction D1.

As shown in FIGS. 5C and 5D, the electronic element 50 is positioned between the first side surface portion 10a and the third side surface portion 10c in the X-axis direction.

As shown in FIGS. 5B and 5D, the electronic element 50 is positioned between the second side surface portion 10b and the fourth side surface portion 10d in the Y-axis direction.

By using the electromagnetic wave attenuator 10A or the electromagnetic wave attenuator 10B, for example, electromagnetic waves in the low frequency range of not more than 100 MHz can be attenuated effectively. An electronic device can be provided in which the attenuation characteristics for electromagnetic waves can be improved.

For example, the electromagnetic waves emitted from the electronic element 50 can be suppressed. For example, the electromagnetic waves from the outside that reach the electronic element 50 can be suppressed. Stable operations are obtained easily in the electronic element 50.

The first planar portion 10p may be, for example, substantially a quadrilateral (including a parallelogram, a rectangle, or a square).

FIGS. 6A to 6D are schematic views illustrating parts of the electronic device according to the second embodiment.

Figure 6A:
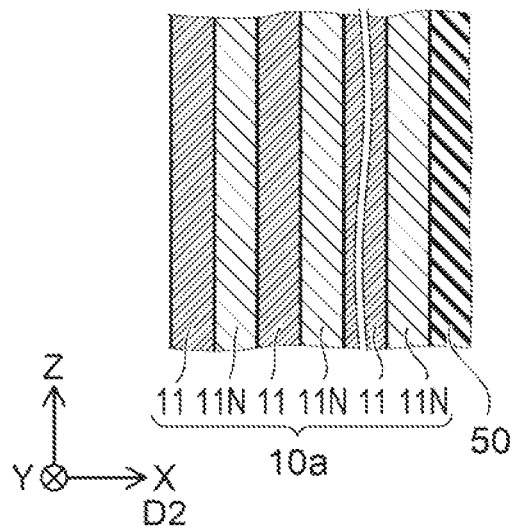
FIGS. 6A to 6D are schematic views illustrating parts of the electronic device according to the second embodiment.

As shown in FIG. 6A, the first side surface portion 10a of the electromagnetic wave attenuator 10 includes the multiple first magnetic layers 11 and the multiple first non-magnetic layers 11N. The stacking direction of the multiple first magnetic layers 11 and the multiple first non-magnetic layers 11N in the first side surface portion 10a is a second direction D2.

Figure 6B:
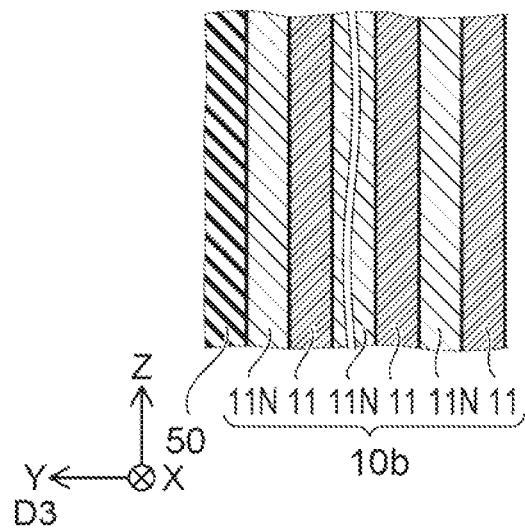

As shown in FIG. 6B, the second side surface portion 10b of the electromagnetic wave attenuator 10 includes the multiple first magnetic layers 11 and the multiple first non-magnetic layers 11N. The stacking direction of the multiple first magnetic layers 11 and the multiple first non-magnetic layers 11N in the second side surface portion 10b is a third direction D3.

Figure 6C:
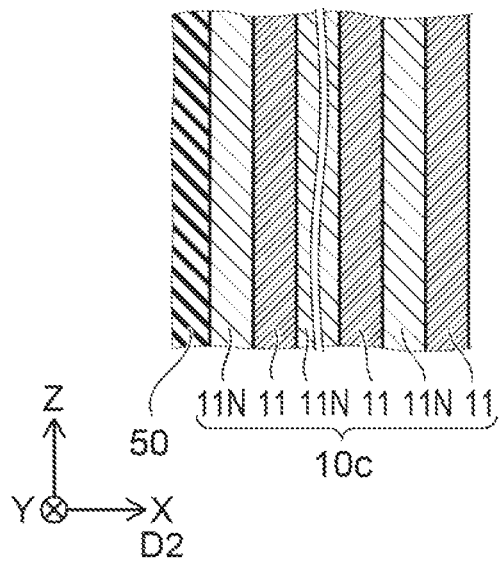

As shown in FIG. 6C, the third side surface portion 10c of the electromagnetic wave attenuator 10 includes the multiple first magnetic layers 11 and the multiple first non-magnetic layers 11N. The stacking direction of the multiple first magnetic layers 11 and the multiple first non-magnetic layers 11N in the third side surface portion 10c is the second direction D2.

Figure 6D:
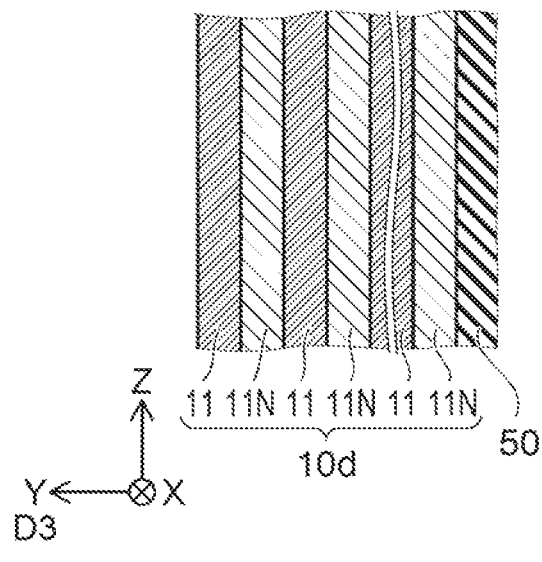

As shown in FIG. 6D, the fourth side surface portion 10d of the electromagnetic wave attenuator 10 includes the multiple first magnetic layers 11 and the multiple first non-magnetic layers 11N. The stacking direction of the multiple first magnetic layers 11 and the multiple first non-magnetic layers 11N in the fourth side surface portion 10d is the third direction D3.

The first magnetic layers 11 that are included in the first to fourth side surface portions 10a to 10d each may be continuous with the first magnetic layer 11 included in the first planar portion 10p. The first non-magnetic layers 11N that are included in the first to fourth side surface portions 10a to 10d each may be continuous with the first non-magnetic layer 11N included in the first planar portion 10p.

Thus, the electronic device 110 according to the embodiment includes the electronic element 50 and the electromagnetic wave attenuator 10 according to the first embodiment. For example, a direction from the electronic element 50 to the electromagnetic wave attenuator 10 is the first direction.

FIGS. 7 to 12 are schematic cross-sectional views illustrating electronic devices according to the second embodiment.

Figure 7:
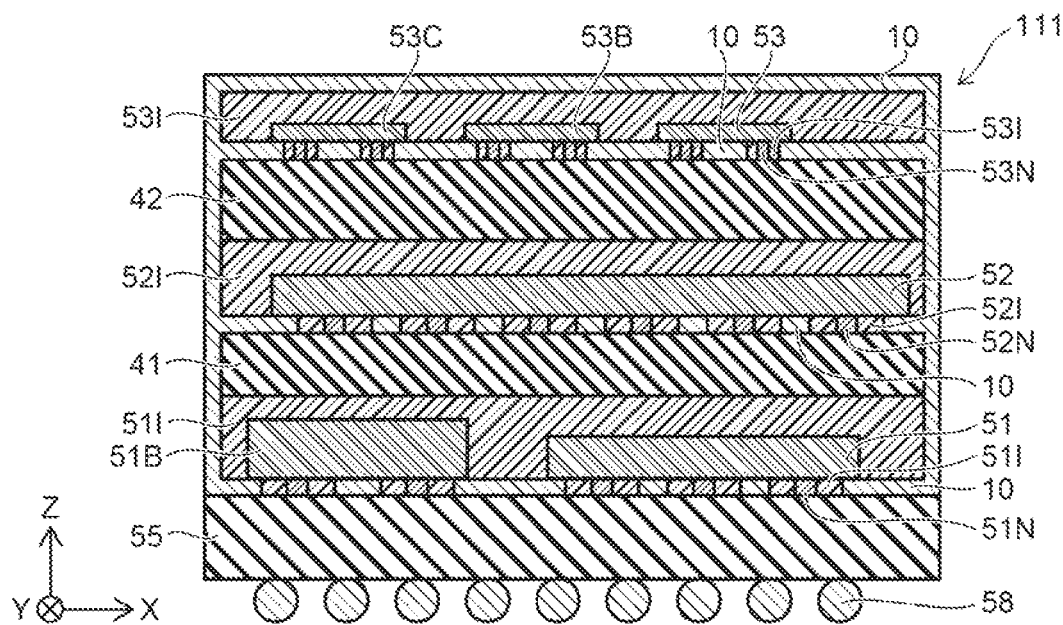
FIG. 7 is a schematic cross-sectional view illustrating an electronic device according to the second embodiment.

As shown in FIG. 7, an electronic device 111 according to the embodiment includes the electromagnetic wave attenuator 10 and multiple electronic elements (electronic elements 51, 51B, 52, 53, 53B, 53C, etc.).

The electronic elements are provided between multiple regions of the electromagnetic wave attenuator 10. An insulating region (insulating portions 41 and 42, etc.) may be provided between the electronic element and one of the multiple regions of the electromagnetic wave attenuator 10. A resin portion (resin portions 511, 521, 531, etc.) may be provided between the electronic element and the insulating region (the insulating portions 41 and 42, etc.). A connection member (connection members 51N, 52N, 53N, etc.) may be provided for each of the multiple electronic elements. For example, the electronic element and the connector 58 may be electrically connected by the connection member.

Figure 8:
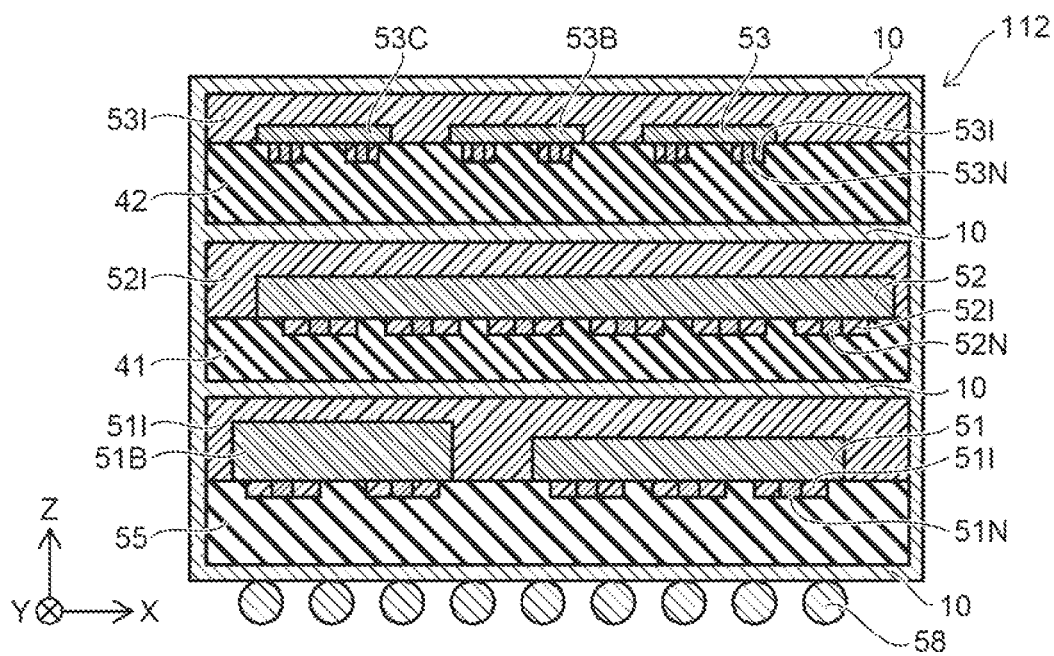
FIG. 8 is a schematic cross-sectional view illustrating an electronic device according to the second embodiment.

As in an electronic device 112 shown in FIG. 8, the connection member 51N may be sunk into a substrate 55. In the electronic device 112, the electromagnetic wave attenuator 10 is provided between the multiple electronic elements. For example, it is suppressed that the electromagnetic waves generated by one of the multiple electronic elements is incident on another one of the multiple electronic elements.

Figure 9:
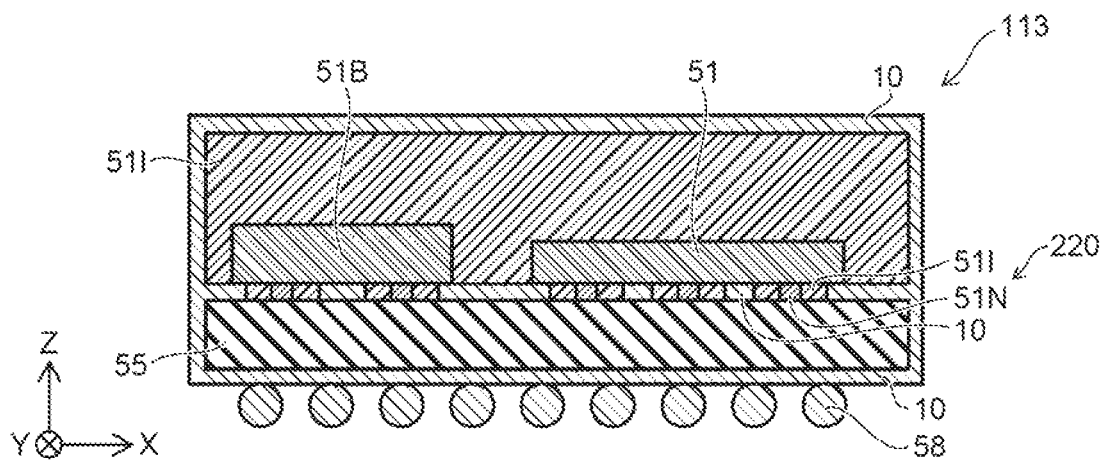
FIG. 9 is a schematic cross-sectional view illustrating an electronic device according to the second embodiment.

As in an electronic device 113 shown in FIG. 9, a mounting member 220 may be provided. The mounting member 220 includes the substrate 55 and the electromagnetic wave attenuator 10. The electronic elements (electronic elements 51 and 51B) are provided between the mounting member 220 and another electromagnetic wave attenuator 10.

Figure 10:
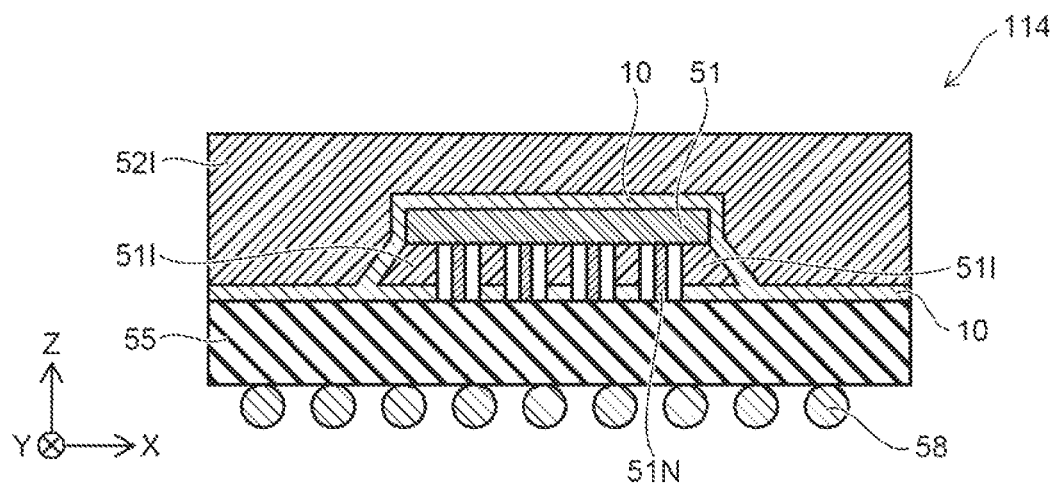
FIG. 10 is a schematic cross-sectional view illustrating an electronic device according to the second embodiment.

As in an electronic device 114 shown in FIG. 10, the electromagnetic wave attenuator 10 may be provided at the side surface of the electronic element 51. The side surface crosses the X-Y plane.

Figure 11:
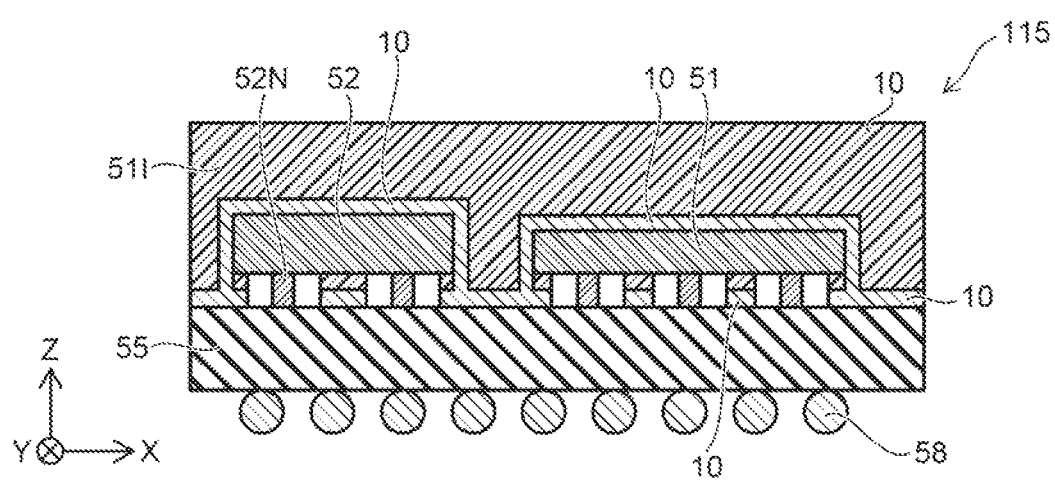
FIG. 11 is a schematic cross-sectional view illustrating an electronic device according to the second embodiment.

As in an electronic device 115 shown in FIG. 11, the electromagnetic wave attenuator 10 may be provided to continuously surround the multiple electronic elements (electronic elements 51 and 52).

Figure 12:
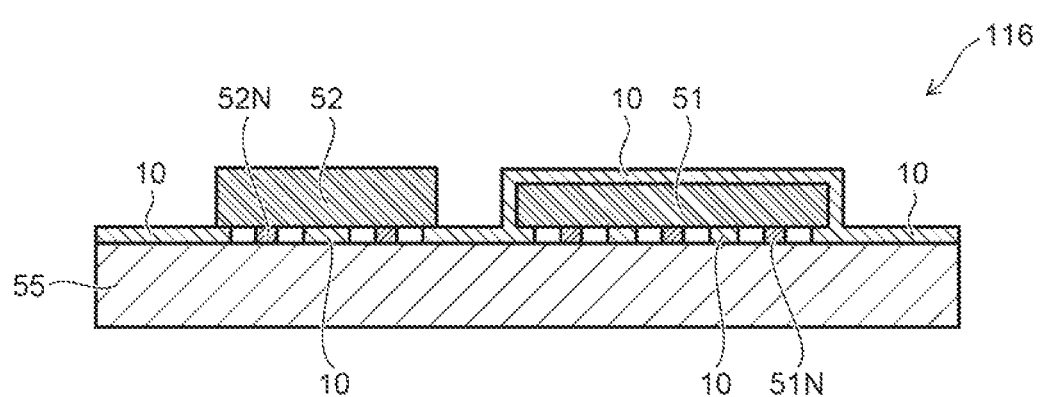
FIG. 12 is a schematic cross-sectional view illustrating an electronic device according to the second embodiment.

As in an electronic device 116 shown in FIG. 12, one of the multiple electronic elements (electronic element 51) is provided between the multiple regions of the electromagnetic wave attenuator 10. Another one of the multiple electronic elements electronic element 52) may not be provided between the multiple regions of the electromagnetic wave attenuator 10.

According to the electronic devices 111 to 116 as well, an electronic device can be provided in which the attenuation characteristics for electromagnetic waves can be improved.

For example, the embodiments are applicable to an electronic device and an electromagnetic wave attenuator for EMC (Electro Magnetic Compatibility).

The embodiments may include the following configurations (e.g., technological proposals).

Configuration 1
An electromagnetic wave attenuator, comprising:
a stacked member, the stacked member including
a base body including a first surface including unevenness,
a first conductive member including Cu, and
a first layer provided between the first surface and the first conductive member, the first layer including Cr and Ti.

Configuration 2
The electromagnetic wave attenuator according to Configuration 1, wherein
the base body includes a plurality of particles and a resin around the plurality of particles.

Configuration 3
The electromagnetic wave attenuator according to Configuration 2, wherein
the plurality of particles include a first element and oxygen, the first element including at least one selected from the group consisting of silicon and aluminum.

Configuration 4
The electromagnetic wave attenuator according to Configuration 2, wherein
the plurality of particles include silicon oxide.

Configuration 5
The electromagnetic wave attenuator according to any one of Configurations 2 to 4, wherein
a diameter of at least one of the plurality of particles is not less than 1 nm and not more than 100 μm.

Configuration 6
The electromagnetic wave attenuator according to any one of Configurations 2 to 5, wherein
the resin includes at least one selected from the group consisting of epoxy and polyimide.

Configuration 7
The electromagnetic wave attenuator according to any one of Configurations 1 to 6, wherein
a height of the unevenness is larger than a thickness of the first layer.

Configuration 8
The electromagnetic wave attenuator according to Configuration 7, wherein
the height is not less than 1 μm or more and not more than 100 μm.

Configuration 9
The electromagnetic wave attenuator according to any one of Configurations 1 to 8, wherein
a thickness of the first layer is not less than 1 nm and not more than 30 nm.

Configuration 10
The electromagnetic wave attenuator according to any one of Configurations 1 to 9, wherein
the stacked member further includes a second layer including Cr and Ti, and
the first conductive member is between the first layer and the second layer.

Configuration 11
The electromagnetic wave attenuator according to Configuration 10, wherein
a thickness of the second layer is not less than 1 nm and not more than 30 nm.

Configuration 12
The electromagnetic wave attenuator according to any one of Configurations 1 to 11, wherein
the first conductive member includes a first stacked body,
the first stacked body includes a plurality of first magnetic layers and a plurality of first non-magnetic layers, the plurality of first non-magnetic layers including Cu, and
one of the plurality of first magnetic layers is between one of the plurality of first non-magnetic layers and an other one of the plurality of first non-magnetic layers.

Configuration 13
The electromagnetic wave attenuator according to Configuration 12, wherein
the one of the plurality of first non-magnetic layers is in contact with the one of the plurality of first magnetic layers and the other one of the plurality of first magnetic layers.

Configuration 14
The electromagnetic wave attenuator according to Configuration 12 or 13, wherein
the plurality of first magnetic layers include at least one selected from the group consisting of Fe, Ni and Co.

Configuration 15

The electromagnetic wave attenuator according to Configuration 14, wherein
the plurality of first magnetic layers include at least one selected from the group consisting of Cu, Mo and Cr.

Configuration 16

The electromagnetic wave attenuator according to any one of Configurations 12 to 15, wherein
the one of the plurality of first magnetic layers includes a first magnetic layer surface facing the one of the plurality of first non-magnetic layers,
the first magnetic layer surface includes a first top portion, a second top portion, and a first bottom portion,
a position of the first bottom portion in a crossing direction is between a position of the first top portion in the crossing direction and a position of the second top portion in the crossing direction, the crossing direction crossing a direction from the one of the plurality of first non-magnetic layer to the other one of the plurality of first non-magnetic layers, and
at least a part of the one of the plurality of first non-magnetic layers is between the first top portion and the second top portion in the crossing direction.

Configuration 17

The electromagnetic wave attenuator according to any one of Configurations 12 to 16, wherein
the first conductive member further includes a second stacked body,
the second stacked body includes a plurality of second magnetic layers and a plurality of second non-magnetic layers,
one of the plurality of second magnetic layers is between one of the plurality of second non-magnetic layers and an other one of the plurality of second non-magnetic layers, and
the plurality of second non-magnetic layers include at least one selected from the group consisting of Ta, Ti, W, Mo, Nb, and Hf.

Configuration 18

The electromagnetic wave attenuator according to Configuration 17, wherein
at least one of the plurality of second non-magnetic layers further includes at least one selected from the group consisting of Cu, Al, Ni, Cr, Mn, Mo, Zr, and Si.

Configuration 19

The electromagnetic wave attenuator according to any one of Configurations 1 to 18, wherein
the stacked member includes a first planar portion and a first side surface portion,
in the first planar portion, a direction from the base body to the first conductive member is along a first direction,
in the first side surface portion, a direction from the base body to the first conductive member is along a second direction, and
the second direction crosses the first direction.

Configuration 20

An electronic device, comprising:
the electromagnetic wave attenuator according to any one of Configurations 1 to 19; and
an electronic element.

According to the embodiment, an electromagnetic wave attenuator and an electronic device can be provided in which the electromagnetic wave can be stably attenuated.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in electromagnetic wave attenuators such as stacked bodies, magnetic layers, nonmagnetic layers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all electromagnetic wave attenuators, and electronic devices practicable by an appropriate design modification by one skilled in the art based on the electromagnetic wave attenuators, and the electronic devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An electromagnetic wave attenuator, comprising:
a stacked member, the stacked member including
a base body including a first surface including unevenness,
a first conductive member including Cu, and
a first layer provided between the first surface and the first conductive member, the first layer including Cr and Ti,
wherein
a height of the unevenness is larger than a thickness of the first layer,
the stacked member further includes a second layer including Cr and Ti,
the first conductive member is between the first layer and the second layer,
the base body includes a plurality of particles and a resin around the particles,
the unevenness is formed to be along the plurality of particles,
a thickness of the first conductive member is not less than 0.5 μm and not more than 100 μm,
the first conductive member includes a first stacked body,
the first stacked body includes a plurality of first magnetic layers and a plurality of first non-magnetic layers, the plurality of first non-magnetic layers including Cu,
one of the first magnetic layers is between one of the first non-magnetic layers and an other one of the first non-magnetic layers,
the one of the first magnetic layers includes a first magnetic layer surface facing the one of the first non-magnetic layers, the first magnetic layer surface includes a first top portion, a second top portion, and a first bottom portion, a position of the first bottom portion in a crossing direction is between a position of the first top portion in the crossing direction and a position of the second top portion in the crossing direction, the crossing direction crossing a direction from the one of the first non-magnetic layer to the other one of the first non-magnetic layers, and at least a part of the one of the first non-magnetic layers is between the first top portion and the second top portion in the crossing direction.

2. The attenuator according to claim 1, wherein the plurality of particles include a first element and oxygen, the first element including at least one selected from the group consisting of silicon and aluminum.

3. The attenuator according to claim 1, wherein the plurality of particles include silicon oxide.

4. The attenuator according to claim 1, wherein a diameter of at least one of the particles is not less than 1 nm and not more than 100 μm.

5. The attenuator according to claim 1, wherein the resin includes at least one selected from the group consisting of epoxy and polyimide.

6. The attenuator according to claim 1, wherein the height is not less than 1 μm or more and not more than 100 μm.

7. The attenuator according to claim 1, wherein a thickness of the first layer is not less than 1 nm and not more than 30 nm.

8. The attenuator according to claim 1, wherein a thickness of the second layer is not less than 1 nm and not more than 30 nm.

9. The attenuator according to claim 1, wherein the one of the first non-magnetic layers is in contact with the one of the first magnetic layers and the other one of the first magnetic layers.

10. The attenuator according to claim 1, wherein the plurality of first magnetic layers include at least one selected from the group consisting of Fe, Ni and Co.

11. The attenuator according to claim 10, wherein the plurality of first magnetic layers include at least one selected from the group consisting of Cu, Mo and Cr.

12. The attenuator according to claim 1, wherein the first conductive member further includes a second stacked body, the second stacked body includes a plurality of second magnetic layers and a plurality of second non-magnetic layers, one of the second magnetic layers is between one of the second non-magnetic layers and an other one of the second non-magnetic layers, and the plurality of second non-magnetic layers include at least one selected from the group consisting of Ta, Ti, W, Mo, Nb, and Hf.

13. The attenuator according to claim 12, wherein at least one of the second non-magnetic layers further includes at least one selected from the group consisting of Cu, Al, Ni, Cr, Mn, Mo, Zr, and Si.

14. The attenuator according to claim 1, wherein the stacked member includes a first planar portion and a first side surface portion, in the first planar portion, a direction from the base body to the first conductive member is along a first direction, in the first side surface portion, a direction from the base body to the first conductive member is along a second direction, and the second direction crosses the first direction.

15. An electronic device, comprising:

the attenuator according to claim 1; and an electronic element.

* * * * *